(12) United States Patent
Carinci et al.

(10) Patent No.: US 11,287,502 B2
(45) Date of Patent: Mar. 29, 2022

(54) METHOD FOR RECORDING MAGNETIC RESONANCE DATA, MAGNETIC RESONANCE DEVICE, COMPUTER PROGRAM, AND ELECTRONICALLY READABLE DATA CARRIER

(71) Applicant: Siemens Healthcare GmbH, Erlangen (DE)

(72) Inventors: Flavio Carinci, Wuerzburg (DE); Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/880,297

(22) Filed: May 21, 2020

(65) Prior Publication Data

US 2020/0371180 A1    Nov. 26, 2020

(30) Foreign Application Priority Data

May 23, 2019    (DE) .......................... 102019207558.4

(51) Int. Cl.
*G01V 3/00* (2006.01)
*G01R 33/483* (2006.01)
(Continued)

(52) U.S. Cl.
CPC ....... *G01R 33/4835* (2013.01); *G01R 33/543* (2013.01); *G01R 33/5617* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

2006/0013460 A1* 1/2006 Dehmeshki ........... G06T 7/0012
382/131
2014/0210471 A1* 7/2014 Stemmer ........... G01R 33/56554
324/309
(Continued)

OTHER PUBLICATIONS

Markus Barth et al: "Simultaneous multislice (SMS) imaging techniques : SMS Imaging"; Magnetic Resonance in Medicine., Bd. 75, Nr. 1, Aug. 26, 2015 (Aug. 26, 2015), pp. 63-81, XP055408927, US ISSN: 0740-31; 2015.
(Continued)

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

Techniques are disclosed for recording magnetic resonance data of an examination object with a magnetic resonance device. A magnetic resonance sequence is used to record the magnetic resonance data from at least two slices of a slice stack, and at least two temporally separate radio frequency pulses are output within an excitation time frame. A slice thickness of the slices, which is increased by an enlargement factor that is greater than one compared with a nominal slice thickness, is used for at least one, but not all, of the radio frequency pulses. The enlargement factor is selected as a function of a distance value describing the distance between two adjacent slices of the slice stack, such that the increased slice thickness does not result in the resulting excitation region of a slice extending into the adjacent slice.

10 Claims, 2 Drawing Sheets

(51) Int. Cl.
*G01R 33/54* (2006.01)
*G01R 33/561* (2006.01)

(58) Field of Classification Search
USPC .......................................................... 324/309
See application file for complete search history.

(56) References Cited

U.S. PATENT DOCUMENTS

| | | | |
|---|---|---|---|
| 2014/0270453 A1 | 9/2014 | Guo et al. | |
| 2015/0226823 A1* | 8/2015 | Speier | G01R 33/5612 324/309 |
| 2015/0253406 A1* | 9/2015 | Nehrke | G01R 33/36 324/309 |
| 2016/0192859 A1* | 7/2016 | Shirai | A61B 5/015 600/412 |

OTHER PUBLICATIONS

Jung Bernd et al:"Spin echo magnetic resonance imaging"; Journal of Magnetic Resonance Imaging; 2013; 37.Jg.; Nr. 4; pp. 805-817; D01 10.1002/jmri.24068; Received Jun. 27, 2011; Accepted Jan. 11, 2013.
German Office Action dated Apr. 16, 2020, for Application No. 102019207558.4.

* cited by examiner

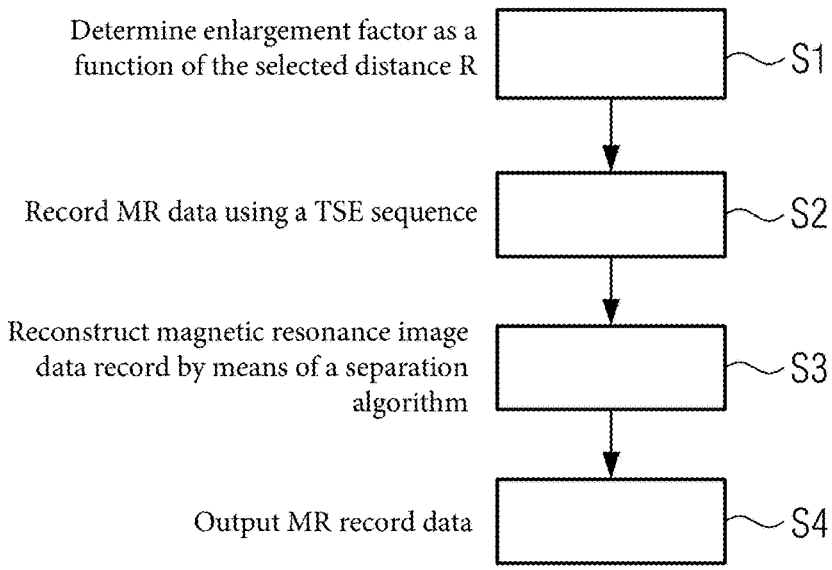
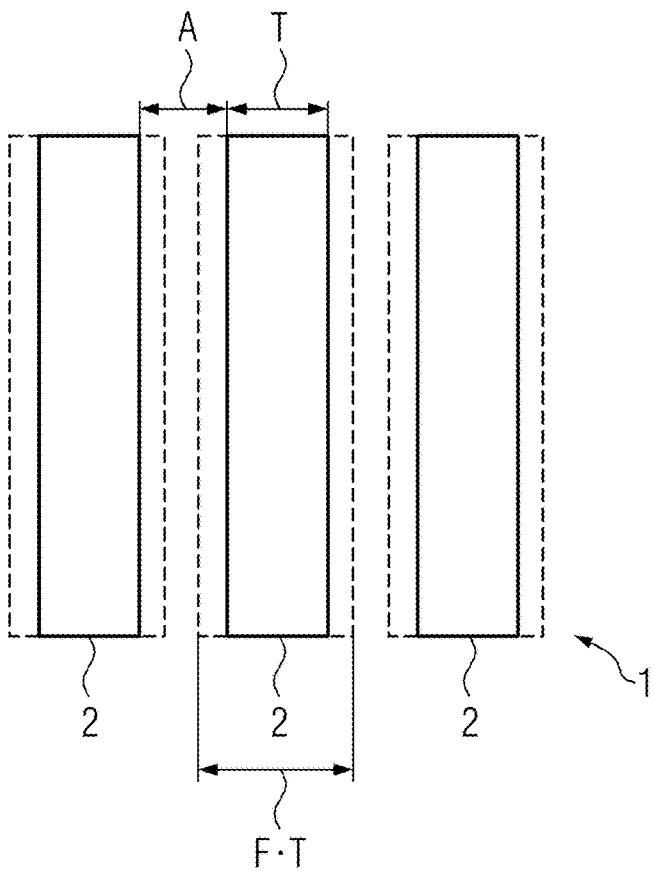

METHOD FOR RECORDING MAGNETIC RESONANCE DATA, MAGNETIC RESONANCE DEVICE, COMPUTER PROGRAM, AND ELECTRONICALLY READABLE DATA CARRIER

CROSS-REFERENCE TO RELATED APPLICATIONS

The present application claims the benefit of the filing date of German patent application no. DE 102019207558.4, filed on May 23, 2019, the contents of which are incorporated herein by reference in their entirety.

TECHNICAL FIELD

The present disclosure relates to techniques for recording magnetic resonance data of an examination object with a magnetic resonance device.

BACKGROUND

Magnetic resonance imaging is an established imaging modality in medical engineering. Current progress efforts are directed both at improving the image quality and at reducing in part the considerable recording times in magnetic resonance recordings. One of the primary aims is the optimization of the signal-to-noise ratio (SNR) to obtain the maximum possible performance with respect to image quality and recording speed. One of the key elements involved in obtaining optimal SNR when recording slices, in other words the 2D imaging, is the slice profile. Problems in this respect may occur in particular if magnetic resonance sequences are used, in the excitation time frame of which a number of radio frequency pulses acting on the slice are to be output in temporal sequence.

SUMMARY

Again, problems may occur if magnetic resonance sequences are used with respect to the excitation time frame of which a number of radio frequency pulses acting on the slice are to be output in temporal sequence. One example of this is the turbo spin echo sequence (TSE) as well as other spin echo-based sequences. In this regard, an excitation pulse and one or more refocusing pulses are used as radio frequency pulses. The resulting slice profile of the recorded magnetic resonance signal, to which the magnetic resonance data thus relates, is the result of an overlap of the slice profiles during excitation and refocusing. In order to optimize the SNR, it was proposed to select the slice thickness for one of the two radio frequency pulses, in other words the excitation pulse or at least one refocusing pulse, to be larger than the nominal (e.g. predetermined, default, or known) slice thickness, in which a specific enlargement factor F can be used, for instance. If the nominal slice thickness is referred to as T, the resulting increased slice thickness may be represented as T*F. In this way, the risk of the slice profile degrading is reduced on account of the overlap effect, as was described.

One approach to accelerating the magnetic resonance imaging is the use of simultaneous multi slice imaging (SMS). During SMS, a number of slices are excited at least essentially simultaneously and read out simultaneously (see Barth et al. "Simultaneous Multi Slice (SMS) Imaging Techniques," Magn Reson Med 75 (2016), pages 63-81). The recorded magnetic resonance signal then contains the magnetic resonance data for all simultaneously recorded slices, and the magnetic resonance data of the individual slices can be extracted again by means of separation algorithms.

If, with the successive recording of slices of a slice stack (typical multi slice imaging) or with SMS imaging, the increased slice thickness selected is too large, crosstalk effects may result between adjacent slices, which may have a relevant influence on the imaging quality. This problem is particularly relevant in SMS imaging. In order to avoid cross talk effects of this type, the enlargement factor is typically fixed and selected to be extremely close to one.

In this way, however, the intended improvement in the SNR can be less, in particular only very partially, such that a significant loss of SNR occurs as a result of the fixed selection of the low value for the enlargement factor (i.e. close to one).

The object underlying the embodiments of the disclosure is therefore to specify a possibility of increasing the SNR in multi slice techniques, such as for SMS imaging for instance.

In order to achieve this object, in accordance with the embodiments of the present disclosure, a method, a magnetic resonance device, a computer program, and an electronically readable data carrier are provided as discussed herein, and further as claimed.

The disclosure relates to a method for recording magnetic resonance data of an examination object with a magnetic resonance device, in which a magnetic resonance sequence is used to record the magnetic resonance data from at least two slices of a slice stack, with which a magnetic resonance sequence of at least two temporally separate radio frequency pulses are output within an excitation time frame, and a slice thickness of the slices is increased by an enlargement factor which is greater than one, compared with a nominal slice thickness, is used for at least one, but not all, of the radio frequency pulses. In addition, the embodiments as discussed herein relate to a magnetic resonance device, a computer program, and an electronically readable data carrier.

In an embodiment of a method as described herein, provision is made in accordance with the present disclosure for the enlargement factor to be selected as a function of a distance value representing the distance between two, e.g. directly adjacent slices of the slice stack such that the increased slice thickness does not result in an expansion of the resulting excitation region of one of the adjacent slices into the adjacent slice.

In accordance with an embodiment of the present disclosure, it is therefore proposed to set the enlargement factor, which can be applied in particular to a specific type of radio frequency pulses in the excitation time frame, as a function of the distance value.

This therefore means that the available space is automatically assessed with respect to the directly spatially adjacent slice in the slice stack, described by the distance value, to use this space as best as possible.

In other words, the enlargement factor also increases with an increasing distance value. The distance value may correspond, for instance, to the expansion of the clearance which exists between two directly adjacent slices of the slice stack.

Reference is to be made here to the distance value being selectable directly and/or indirectly by a user, for instance if the user determines the slices to be recorded simultaneously or the slice sequence in a consecutive recording.

It should be noted that it is also conceivable to select the slice, for a slice, which is next to the recording activity in terms of time and space, and which need not then be the directly adjacent slice. Because with the determination of the sequence of the slice recording or the slices to be recorded simultaneously during the SMS imaging, on account of the crosstalk effects which are also possible when restricting to the respective nominal slice thicknesses, the largest possible distance is frequently selected, which can, if applicable, be used by the embodiments described herein provided that an adequate relaxation is taking place.

In order to avoid levelling out the gain in SNR due to crosstalk effects or even cause an overall worsening, the enlargement factor may also be restricted such that the increased slice thickness does not protrude into the slice which is most closely, e.g. directly adjacent to, the recording sequence, if applicable also in terms of time and space.

Overall, a significantly larger enlargement factor can therefore be selected in many cases by taking the distance into account, such that a significant increase in the SNR is provided compared with a conservative, careful selection extremely close to one. This applies in particular with respect to SMS imaging.

The embodiments of the present disclosure may be particularly advantageous when applied to spin echo sequences, for instance the turbo spin echo sequence (TSE), as a magnetic resonance sequence. In other words, a spin echo sequence, in particular a TSE sequence, with an excitation pulse and a refocusing pulse as a radio frequency pulse, can be used as the magnetic resonance sequence, in which the increased slice thickness is used in the excitation pulse or in the refocusing pulse. It is particularly expedient here to use overall the increased slice thickness with a number of refocusing pulses, so that the increase, generally speaking, may be applied with respect to a type of radio frequency pulses.

The enlargement factor can expediently be determined from the distance value by a functional relationship.

Here, the functional relationship advantageously provides for a direct proportionality between the enlargement factor and the distance value. It has proven to be a particularly expedient choice of a distance value when the distance value describes the distance relative to the nominal slice thickness, and therefore may be determined as the actual distance divided by the nominal slice thickness. With the example distance between two directly adjacent slices of the slice stack, which is usually smaller than a nominal slice thickness, it can therefore be said that the distance value describes the fraction of the nominal slice thickness which forms the distance. If the distance that is actually present is referred to as A, the nominal slice thickness is referred to as T, and the distance value as R, then $R=A/T$. $F=f(R)$ applies to the increased slice thickness F, wherein f describes the functional relationship. Here, the functional relationship can finally be selected arbitrarily provided $1 \leq F \leq (R+1)$ applies, and a direct proportionality may be described by f.

In an advantageous development of the embodiments of the present disclosure, provision can specifically be made to ensure that the functional relationship, in order to extend the excitation region with respect to the nominal slice thickness, results in a usage of any suitable range of the distance described by the distance value (e.g. 20 to 55%, 20 to 45% of the distance described by the distance value, etc.). The use of proportions of the distance of this type for extension based on the nominal slice thickness has proven to be particularly advantageous, since on the one hand a significant extension is given, and on the other hand a safety distance effectively avoiding a crosstalk effect is maintained from the next closest slice. This safety distance preferably also still present with respect to its increased slice thickness so that a value of less than 50%, (e.g. 25% or 30%) has proven particularly useful.

Significant improvements in the SNR have resulted with examinations and experiments using the procedures described in accordance with the embodiments herein. By way of example, increases in the signal amplitude of e.g., 10% have become apparent for examinations in which the distance value R, as defined above, amounts to 0.2 and a factor F of 1.1 results from the functional relationship (use of 25% of the distance), with the TSE-SMS imaging when applying the increased slice thickness in the refocusing pulses, for instance.

In addition to the method, the present disclosure also includes embodiments of a magnetic resonance device, which may include a control device configured to carry out the embodiments of the methods as described herein. All embodiments with respect to the method can be carried out similarly by or with respect to the magnetic resonance device, with which the same advantages can thus be obtained. The control device can include, for instance, one or more processor, hardware components, software components, a storage means, or any combination of these. The various units as shown and described herein may implement hardware (e.g., processors), software, or a combination of both. Thus, the control device and/or other various components as described herein may alternatively be referred to as "circuitry," an "apparatus," a "unit," or a "device."

The control device may include functional units to realize different steps of the embodiments of the methods as described herein. For instance, the control device may include a sequence unit for controlling the actual data acquisition.

Provision can further be made for a determination unit for determining the enlargement factor as a function of the distance value.

Embodiments also include a computer program that may be loaded directly into a non-transitory computer-readable medium (e.g. storage device) of a control device of a magnetic resonance device, for instance. The computer program may include executable instructions and/or code such that, when executed by one or more processors of the control device and/or the magnetic resonance device, may carry out or otherwise execute the steps of the method embodiments as discussed herein, if the computer program is executed in the control device of the magnetic resonance device. The computer program can be stored on an electronically readable data carrier that therefore comprises electronically readable control information stored thereon, which comprises at least one computer program and is configured such that, on use of the data carrier in a control device of a magnetic resonance device, it executes the steps of the method embodiments as discussed herein. Again, the data carrier may be in particular a non-transitory data carrier, for instance a CD-ROM or other suitable storage medium.

BRIEF DESCRIPTION OF THE DRAWINGS/FIGURES

Further advantages and details of the present disclosure are disclosed in the exemplary embodiments described below and by reference to the drawings, in which:

FIG. 1 shows a flow chart of an example method, in accordance with various embodiments of the present disclosure;

FIG. 2 shows an illustration of an example proportion of a slice stack, in accordance with various embodiments of the present disclosure;

DETAILED DESCRIPTION

Figure 3:
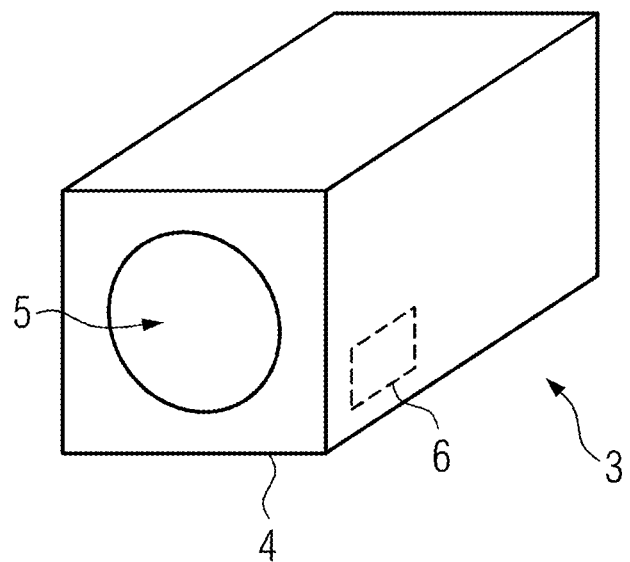
FIG. 3 shows an illustration of an example magnetic resonance device, in accordance with various embodiments of the present disclosure.

FIG. 1 shows a flow chart of an example method, in accordance with various embodiments of the present disclosure. In this regard, magnetic resonance data may be recorded from the slices of a slice stack, e.g. using SMS imaging, by means of a TSE sequence as a magnetic resonance sequence, for instance. The slices of the slice stack may have a specific slice thickness, currently referred to as T. Moreover, the slices of the slice stack may be distanced from one another by a distance $A=R*T$, in which the distance value R can amount to 0.2, for instance, and may be selected by a user.

Before recording the first magnetic resonance data, in a step S1, an enlargement factor is determined as a function of the selected distance value R. To this end, a functional relationship is provided, according to which the enlargement factor, referred to as F, correlates in direct proportion with the distance value R, namely such that F lies between one and (R+1). This means that $F=f(R)$.

Here, the enlargement factor also becomes bigger with an increasing distance, in other words increasing distance value.

f(R) is currently selected such that 25% of the distance present between two directly adjacent slices of the slice stack can additionally be used by the increased slice width. On the other side, since a partial widening also takes place for the directly adjacent slice, as shown in more detail below, a certain clearance is also left with the increased slice thickness, in order here to avoid interactions, which may influence the image quality, as far as possible. As an example, 20 to 45% of the distance may be used in each case for increased slice thicknesses of the respective directly adjacent slices of the slice stack.

In step S2, the magnetic resonance data is then recorded using the TSE sequence. Here, in the excitation time frame the excitation pulses (as a first type of radio frequency pulses) act on the nominal slice thickness T, while the at least one refocusing pulse (as a second type of radio frequency pulses) act on the increased slice thickness $F*T$.

The resulting magnetic resonance data is thus improved in particular with respect to the SMS imaging and its SNR.

With the use of the SMS imaging, the assignment to the respective slices recorded simultaneously is carried out in step S3 within the scope of reconstructing a magnetic resonance image data record by means of a separation algorithm. The separation algorithm may be implemented in accordance with any suitable techniques, including known techniques. The magnetic resonance data record obtained as a result may then be output, stored, or used further in other ways (see step S4).

FIG. 2 shows an illustration of an example proportion of a slice stack, in accordance with various embodiments of the present disclosure. FIG. 2 explains the approach in a schematic view of one part of the slice stack 1 in more detail. Here, for ease of explanation, the distance A between the slices 2 is shown larger. The distance A results as $R*T$, wherein R, as shown, representing the distance value. The increased slice thicknesses $F*T$ are also shown dashed. Here, as shown, F results via the functional relationship f(R) from R.

FIG. 3 shows an illustration of an example magnetic resonance device, in accordance with various embodiments of the present disclosure. The magnetic resonance device includes a main magnet unit 4, which contains the basic field magnet and has a patient receptacle 5 as a borehole, into which a patient, as an examination object, can be introduced by means of a patient couch (not shown). Surrounding the patient receptacle 5 are a radio frequency coil arrangement and a gradient coil arrangement of the magnetic resonance device 3.

Figure 4:
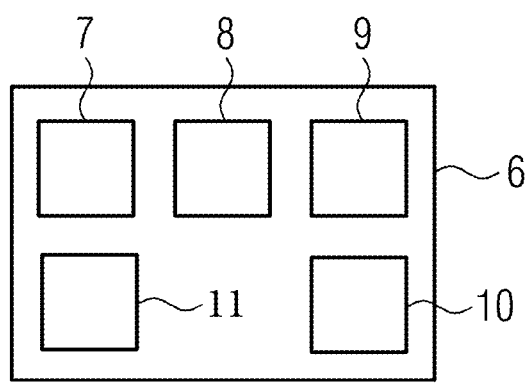
FIG. 4 shows an illustration of the functional design of a control device of the magnetic resonance device, in accordance with various embodiments of the present disclosure.

Operation of the magnetic resonance device 3 is controlled by a control device 6, which is embodied to carry out the embodiments of the method as described herein. Thus, as shown in FIG. 4, the control device 6 may include a determination unit 7 (e.g. determination circuitry) for carrying out the step S1. The recording of the magnetic resonance data can be controlled by way of sequence unit 8 (e.g. sequence circuitry), which may be implemented as any suitable type or configuration of a sequence unit, including known implementations.

The control device 6 may also include a reconstruction unit 9 (e.g. reconstruction circuitry) configured to carry out the step S3 and an output unit 10 (execution or output circuitry) for executing step S4.

Furthermore, the control device 6 may include one or more storage devices 11, which may represent any suitable type of memory that is configured to store executable and/or machine-readable instructions, code, etc. The storage device (s) 11 may include, for instance, volatile or non-volatile memory (e.g. non-transitory computer-readable media) storing such instructions that, when executed by the control device 6, one or more components of the control device 6, and/or the magnetic resonance device 3, performs the functions associated with the embodiments as discussed herein. For instance, instructions stored in the storage device(s) 11 may enable the magnetic resonance device 3 to perform the method as discussed herein with respect to FIGS. 1 and 2. Although illustrated in FIG. 4 as being integrated as part of the control device 6, this is by way of example and not limitation. The storage device(s) 11 may additionally or alternatively be stored in other suitable locations accessible via the magnetic resonance device 3, such as network storage, cloud storage, etc.

Although the disclosure has been illustrated and described in greater detail on the basis of the preferred exemplary embodiments, the disclosure is not limited by the disclosed examples, and other variations may be derived by the person skilled in the art without leaving the scope of protection of the disclosure.

What is claimed is:

1. A method for recording magnetic resonance (MR) data of an examination object with a MR device, comprising:

selecting an enlargement factor as a function of a distance value that represents a distance between two adjacent MR slices of a MR slice stack such that, when a MR slice thickness identified with a radio frequency (RF) pulse is increased by the enlargement factor to provide an increased MR slice thickness, an excitation of a region of one of the two adjacent MR slices that extends into the other one of the two adjacent MR slices is prevented;

increasing the MR slice thickness by the enlargement factor; and executing a MR sequence using the increased MR slice thickness for at least one, but not all, of at least two temporally separate RF pulses to record the MR data from at least two MR slices of the MR slice stack, in which at least two temporally separate RF pulses are output within (i) an excitation time frame, and (ii) a MR slice thickness of the at least two MR slices of the MR slice stack.

2. A magnetic resonance (MR) device for recording MR data of an examination object, comprising:
a main magnet unit; and
control circuitry configured to:
select an enlargement factor as a function of a distance value that represents a distance between two adjacent slices of a slice stack such that, when a slice thickness identified with a radio frequency (RF) pulse is increased by the enlargement factor to provide an increased slice thickness, an excitation of a region of one of the two adjacent slices that extends into the other one of the two adjacent slices is prevented;
increase the slice thickness by the enlargement factor; and
execute a MR sequence using the increased slice thickness for at least one, but not all, of at least two temporally separate RF pulses to record the MR data from at least two slices of the slice stack, in which at least two temporally separate RF pulses are output within (i) an excitation time frame, and (ii) a slice thickness of the at least two slices of the slice stack.

3. A non-transitory computer-readable medium having instructions stored thereon that, when executed by one or more processors of a magnetic resonance (MR) device, cause the MR device to record MR data of an examination object by:
selecting an enlargement factor as a function of a distance value that represents a distance between two adjacent slices of a slice stack such that, when a slice thickness identified with a radio frequency (RF) pulse is increased by the enlargement factor to provide an increased slice thickness, an excitation of a region of one of the two adjacent slices that extends into the other one of the two adjacent slices is prevented;
increasing the slice thickness by the enlargement factor; and
executing a MR sequence using the increased slice thickness for at least one, but not all, of at least two temporally separate RF pulses to record the MR data from at least two slices of the slice stack, in which at least two temporally separate RF pulses are output within (i) an excitation time frame, and (ii) a slice thickness of the at least two slices of the slice stack.

4. The method as claimed in claim 1, wherein the MR sequence is a spin echo sequence with an excitation pulse and a refocusing pulse as a RF pulse, and
wherein the increased MR slice thickness is used in the excitation pulse or in the refocusing pulse.

5. The method as claimed in claim 1, wherein selecting the enlargement factor includes determining the enlargement value based on the distance value using a functional relationship.

6. The method as claimed in claim 5, wherein the distance value represents a distance relative to a predetermined MR slice thickness.

7. The method of claim 5, wherein the functional relationship represents a direct proportionality between the enlargement factor and the distance value.

8. The method as claimed in claim 6, wherein the functional relationship results in an extension of the excitation region compared with the predetermined MR slice thickness for use of 20 to 55% of the distance represented by the distance value.

9. The method of claim 6, wherein the functional relationship results in an extension of the excitation region compared with the predetermined MR slice thickness for use of 20 to 45% of the distance represented by the distance value.

10. The method as claimed in claim 1, wherein recording of the MR data from each of the at least two MR slices of the MR slice stack occurs simultaneously via a MR sequence in accordance with a simultaneous multi slice imaging technique (SMS).

* * * * *